United States Patent
Henttonen

(10) Patent No.: US 7,265,442 B2
(45) Date of Patent: Sep. 4, 2007

(54) STACKED PACKAGE INTEGRATED CIRCUIT

(75) Inventor: Timo Henttonen, Ylöjärvi (FI)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 11/086,982

(22) Filed: Mar. 21, 2005

(65) Prior Publication Data
US 2006/0208358 A1 Sep. 21, 2006

(51) Int. Cl.
H01L 23/02 (2006.01)
(52) U.S. Cl. .................. 257/686; 257/685; 257/777; 257/E25.006; 257/E25.013; 257/E25.027; 257/E23.085; 438/109
(58) Field of Classification Search ............ 257/685, 257/686, 777, E25.006, E25.027, E23.085, 257/E21.614; 438/109, FOR. 368, FOR. 426
See application file for complete search history.

(56) References Cited
U.S. PATENT DOCUMENTS

| 6,982,488 B2* | 1/2006 | Shin et al. ............. 257/777 |
| 2004/0113253 A1* | 6/2004 | Karnezos ............. 257/686 |
| 2005/0121764 A1* | 6/2005 | Mallik et al. ............. 257/777 |
| 2006/0035409 A1* | 2/2006 | Suh et al. ............. 438/109 |
| 2006/0108676 A1* | 5/2006 | Punzalan et al. ............. 257/686 |
| 2006/0175696 A1* | 8/2006 | Kim ............. 257/686 |

* cited by examiner

*Primary Examiner*—Jasmine Clark
(74) *Attorney, Agent, or Firm*—Ware, Fressola, Van Der Sluys & Adolphson, LLP

(57) ABSTRACT

The invention relates to an integrated circuit, electronic device, and method for assembling an integrated circuit package with at least one bottom module with a stacked die package comprising at least two dies within one single mold cap. To allow chip area reduction, the invention provides at least one memory module stacked on top of the bottom module using a ball grid array.

16 Claims, 2 Drawing Sheets

STACKED PACKAGE INTEGRATED CIRCUIT

FIELD OF THE INVENTION

The invention relates in general to an integrated circuit package with at least one bottom module with a stacked die package comprising at least two dies within one single mold cap.

The invention also relates in general to a system comprising at least one bottom module with a stacked die package comprising at least two dies within one single mold cap.

The invention further relates in general to a method for assembling an integrated circuit package with providing at least one bottom module with a stacked die package comprising at least two dies within one single mold cap.

BACKGROUND

Today, packing dies within integrated circuits is common knowledge. By packing different dies within one single mold, a package may provide increased functionality. It may also be possible to pack different application specific integrated circuits (ASIC) into one single mold cap to provide different functionality within one chip.

For instance, a main digital baseband application specific integrated circuit (ASIC) for high speed data packet access (HSDPA) and a protocol specific digital modem ASIC may be stacked on top of each other within single package. The integration within a single package allows providing HSDPA functionality by one single device.

Stacked chip scale packages (stacked CSP) with two or more dies stacked within a single package assembly are known. These stacked packages may be organic packages, which are wirebonded and overmolded in a chip scale package profile. Typical ball pitch ranges from 0.5 to 0.8 mm for these packages. Also ball grid arrays using full-sized balls with only 0.5 mm maximum height are known. These chips are used in surface down configuration. The printed circuit board (PCB) may be connected to these chips through wirebonding.

However, as there is a need to reduce the baseband area of chips, further size reduction, in particular in terms of chip area, is necessary.

SUMMARY

To allow reducing chip area and to provide more functionality within the same chip area, the invention provides an integrated circuit package with at least one bottom module with a stacked die package comprising at least two dies within one single mold cap and a substrate carrying the stacked die package and comprising connection elements, and at least one memory module stacked on top of the bottom module using a ball grid array, wherein the ball grid array connects the memory module with the connection elements of the substrate.

Using stacked dies in stacked packages in a bottom package and packing a memory module on top of the bottom module allows size reduction of the baseband of the chip.

For instance it may be possible to have a stacked DIGITAL BB ASIC and PROTOCOL SPECIFIC DIGITAL MODEM ASIC package in the bottom module. This stacked die package may be stacked with a memory module package on top. However, any other ASIC may be provided within the stacked die of the bottom module.

The stacking of the top module on top of the bottom module may be done by providing the connection balls at areas, where the mold cap of the bottom module does not cover the substrate of the bottom module. The substrate of the bottom module may carry the packed package. The substrate may as well carry connection elements for connecting the integrated circuit with further elements. The connection elements may be solder balls or lead pads or any other elements capable of electrically connecting elements. The connecting elements may, for instance, be arranged on the side of the substrate opposite to the packed package. Connections between the packages and the connection elements may be provided by via connecting wires, running through the substrate.

The size of the substrate may be larger than the size of the packed package. The areas not covered by the packed package may be used for carrying the solder balls for connection the upper element with the lower element. The substrate may provide connection wires for connecting the solder balls with the packed package dies. In addition, the solder balls may connect via connection elements, to be connected to outside elements.

To provide stacking of the memory module on top of the stacked die package, embodiments provide sizing the balls of the ball grid array, so as to allow packing the memory module on top of the stacked die package. By increasing the size of the solder balls of the ball grid array, the distance between the package substrate of the bottom module and the package substrate of the top module may be chosen so as to allow providing the single mold cap in between these modules. The solder balls provide a distance between the upper surface of the substrate of the lower module and the lower surface of the substrate of the upper module. The mold cap together with the stacked package may be placed in between the substrates.

To allow packing stacked dies with two different dies and a memory module on top, embodiments provide ball sizes of at least 0.5 mm. In such a case, the distance between the substrates is approximately 0.5 mm.

The ball pitch between the top and bottom package may also be increased so as to enable the use of stacked die packages with a thicker mold cap at the bottom package. Embodiments provide a ball pitch of the ball grid array, which allows packing a memory module on top of the stacked die package. Embodiments provide a ball pitch of at least 0.8 mm.

To provide packing of packages, the ball size and/or the ball pitch of the balls for packing the memory module on top of the stacked die package may be defined by the thickness of the single mold cap.

The dies within the stacked die package may be application specific integrated circuits (ASIC), memory modules or any combination thereof. For instance, the bottom module may comprise two applications specific integrated circuits or one application specific integrated circuit and one memory module. These dies may be encapsulated within one single mold cap. To allow packing the top module on top of the bottom module, the size of the interconnecting balls may be chosen such that the single mold cap fits in between the lower package substrate and the upper package substrate.

For instance, according to an exemplary embodiment, the bottom package may use wirebonding to interconnect the dies to the package substrate. Each of the dies within the package substrate may have a thickness of 100 µm. The die attach thickness may, for instance, be 25 µm. The mold cap for encapsulating the at least two dies may be 375 µm. To allow packing the top module on top of the bottom module, for instance, the ball pitch may be 0.8 mm and the ball size may be 0.5 mm.

Another aspect of the invention is a system comprising at least one bottom module with a stacked die package comprising at least two dies within one single mold cap and a substrate carrying the stacked die package and comprising connection elements, and at least one memory module stacked on top of the bottom module using a ball grid array, wherein the ball grid array connects the memory module with the connection elements of the substrate.

Another aspect of the invention is an electronic device comprising an integrated circuit package with at least one bottom module with a stacked die package comprising at least two dies within one single mold cap and a substrate carrying the stacked die package and comprising connection elements, and at least one memory module stacked on top of the bottom module using a ball grid array, wherein the ball grid array connects the memory module with the connection elements of the substrate.

Yet a further aspect of the invention is a method for assembling an integrated circuit package providing at least one bottom module with a stacked die package comprising at least two dies within one single mold cap and a substrate carrying the stacked die package and comprising connection elements, and stacking at least one memory module on top of the bottom module using a ball grid array, wherein the ball grid array connects the memory module with the connection elements of the substrate.

DETAILED DESCRIPTION OF THE DRAWINGS

Figure 1:
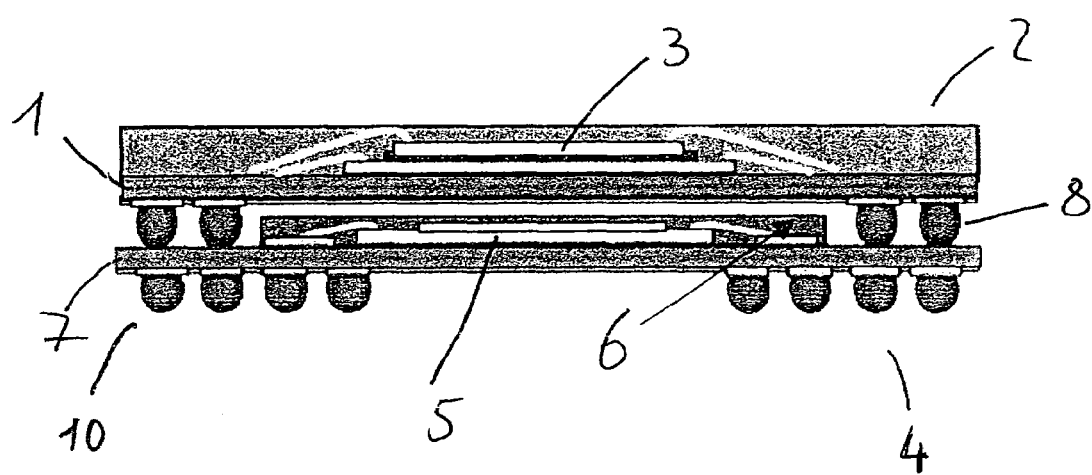
FIG. 1 shows an exemplary integrated circuit package with a top module and a bottom module according to an embodiment of the invention.

FIG. 1 depicts an exemplary assembly of an integrated circuit package. The integrated circuit package may comprise a memory package 2, and an ASIC package 4.

Memory package 2 may comprise memory dies 3, a substrate 1 carrying the dies 3, and a memory interface 8. The substrate 1 carries the encapsulated dies. The dies are connected to via connection elements by connection lead wires. The via connection elements and the connection lead wires allow connecting the dies with the solder balls of the memory interface 8. Memory package 2 may be connected to ASIC package 4 by memory interface 8.

ASIC package 4 may comprise a region 5 with at least two dies (not shown) within a stacked package. The region 5 may be encapsulated within a single mold cap 6. Connection lead wires allow connection the dies of the region 5 with bonding pads. The encapsulated dies of the region 5 are carried by substrate 7. Substrate 7 allows bonding the encapsulated dies of the region 5. Substrate 7 may carry solder balls 10 as connection elements for connecting the integrated circuit with other elements.

ASIC package 4 may be connected to a printed wiring board by the solder balls 10. Solder balls 10 may also connect the solder balls of memory interface 8 with a PCB.

Memory package 2 may comprise at least two memory dies 3. These memory dies 3 may be encapsulated within one single mold cap. The memory dies 3 may be connected to the memory interface 8 by interconnection lead wires, which allow connecting the dies to the substrate.

Memory interface 8 allows connecting the memory package 2 to connection areas within the substrate 7 of ASIC package 4. The memory interface 8 may have a plurality of connection pins. The connection pins may be solder balls and arranged as ball grid array. The pin count may be defined by required memory types and densities to be supported.

To allow packing of memory package 2 onto ASIC package 4, the ball pitch of the solder balls of the memory interface 8 may be 0.8 mm and the ball sizes may be 0.5 mm. The solder balls of the memory interface 8 may be arranged on the lower surface of the substrate 1 at locations where the upper surface of substrate 7 does not carry the stacked package. The surface 7 may provide areas for carrying the stacked package as well as areas for carrying the solder balls of the memory interface 8.

The ASIC package 4 may comprise various dies of the region 5, which may be, for instance MAIN DIGITAL BB ASIC or PROTOCOL SPECIFIC DIGITAL MODEM ASIC dies. The size and amount of interconnecting lead wires may determine the mold cap area. The thickness of the dies of the region 5 and the interconnection lead wires loop height, as well as the die attach thickness may define the minimum required mold cap 6 thickness.

The mold cap 6 thickness may be, as previously stated, defined by thickness of the dies of the region 5, the height of the interconnection lead wire loops and the attach thickness of the dies of the region 5. The thickness of the mold cap 6 may define the required stand-off between the substrate 1 of memory package 2 and the substrate 7 of ASIC package 4. The mold cap 6 needs to fit in between the lower surface of substrate 1 memory package 2 and the upper surface 7 of ASIC package 4. This distance may define the minimum required ball pitch and ball size of the memory interface 8.

The solder balls 10 for connecting the whole integrated circuit to a printed wiring board may comprise various pins. The number of pins may be defined by functional input/output operations in the ASIC package 4 and the required power and ground pins for the memory dies within memory package 2.

The overall package size may be defined by the mold cap size, the mold cap thickness, the size of memory interface 8, the minimum distance between the balls of memory interface 8 or solder balls 10 and the edges of substrates 1, 7, as well as the substrates routing complexity.

The substrate 7 may provide two areas. One for carrying the ASIC package 4 and one for carrying the solder balls of memory interface 8. The size of the solder balls of memory interface 8 defines the stand-off between the substrates 1, 7. This distance may define the maximum size of the mold cap 6. By sizing the solder balls of memory interface 8 accordingly, a mold cap carrying at least two packed dies may fit in between the substrate 1, 7.

The invention enables stacked die stacked packaging and enables chip area reduction. To reduce the thickness of the overall package, thinner dies of the region 5 within the ASIC package 4 may be used. Also, the interconnection wire loops may be designed to be lower, enabling a thinner mold cap. This may allow reduction of ball pitch and ball size, thus reducing the overall size.

Figure 2:
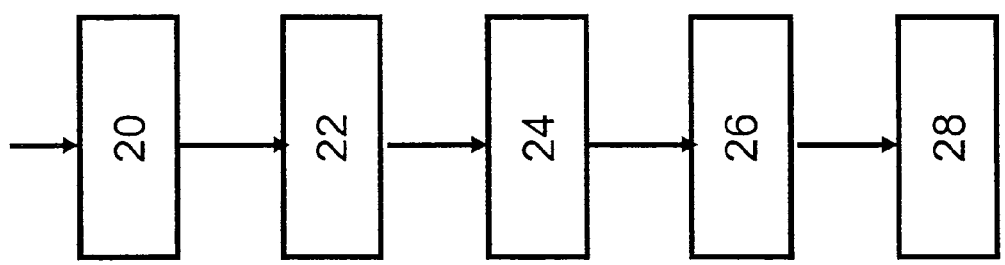
FIG. 2 shows an exemplary method for providing an integrated circuit package according to an embodiment of the invention.

FIG. 2 shows a method for assembling an integrated circuit with die packaging. In a step 20, a substrate is provided with at least two dies.

In a next step 22, these dies are by wirebonded to the substrate. The substrate provides via connections for connecting the elements with solder balls of a ball grid array arranged on the other surface of the substrate. After the dies are connected to the ball grid array, a mold cap is provided, encapsulating the dies as shown in a step 24.

The resulting stacked die package may then be assembled with the memory package in a step 26. Therefore, the memory package, comprising memory dies within a single mold having a memory interface on the lower surface of a substrate may be provided in a step 28. The memory interface may be designed such that the ball size and ball pitch of the solder balls are chosen such that the distance between the upper surface of the ASIC package substrate and the lower surface of the memory package substrate allows placing the mold cap in between. For example, the ball pitch may be chosen as 0.8 mm and the ball size may be chosen as 0.5 mm (28). The balls of the memory interface may be arranged such that they may be carried by the lower substrate within areas, where no ASIC package is arranged.

During assembly, the dies of the ASIC package may be chosen with a thickness of 100 μm. The attach thickness for attaching the dies on top of each other and on top of the substrate may be 25 μm. A mold cap having a size of 375 μm may encapsulate the dies of ASIC package. This mold cap may be placed in between the substrates of the upper and lower assembly, thus providing a stacked die stacked package.

What is claimed is:

1. An integrated circuit package with
   at least one bottom module with a stacked die package comprising at least two dies within one single mold cap and a substrate carrying the stacked die package and comprising connection elements, and
   at least one memory module stacked on top of the bottom module using a ball grid array, wherein the ball grid array connects the memory module with the connection elements of the substrate
   wherein balls of the ball grid array have a size that allows packing the memory module on top of the stacked die package, and
   wherein balls of the ball grid array have a size that is at least 0.5 mm.

2. The integrated circuit package of claim 1, wherein a ball pitch of the ball grid array allows packing the memory module on top of the stacked die package.

3. The integrated circuit package of claim 1, wherein a ball pitch of the ball grid array is at least 0.8 mm.

4. The integrated circuit package of claim 1, wherein the single mold cap has a thickness that defines ball size, ball pitch, or both, for packing the memory module on top of the stacked die package.

5. The integrated circuit package of claim 3, wherein the single mold cap has a thickness of 375 μm.

6. The integrated circuit package of claim 1, wherein the dies of the bottom module comprise application specific integrated circuits, or memory modules, or any combination thereof.

7. A system comprising
   at least one bottom module with a stacked die package comprising at least two dies within one single mold cap and a substrate carrying the stacked die package and comprising connection elements, and
   at least one memory module stacked on top of the bottom module using a ball grid array, wherein the ball grid array connects the memory module with the connection elements of the substrate
   wherein balls of the ball grid array have a size that allows packing the memory module on top of the stacked die package, and
   wherein balls of the ball grid array have a size that is at least 0.5 mm.

8. An electronic device comprising an integrated circuit package with at least one bottom module with a stacked die package comprising at least two dies within one single mold cap and a substrate carrying the stacked die package and comprising connection elements, and at least one memory module stacked on top of the bottom module using a ball grid array, wherein the ball grid array connects the memory module with the connection elements of the substrate
   wherein balls of the ball grid array have a size that allows packing the memory module on top of the stacked die package, and
   wherein balls of the ball grid array have a size that is at least 0.5 mm.

9. A method for assembling an integrated circuit package comprising
   providing at least one bottom module with a stacked die package comprising at least two dies within one single mold cap and a substrate carrying the stacked die package and comprising connection elements, and
   stacking at least one memory module on top of the bottom module using a ball grid array, wherein the ball grid array connects the memory module with the connection elements of the substrate
   wherein balls of the ball grid array have a size that allows packing the memory module on top of the stacked die package, and
   wherein balls of the ball grid array have a size that is at least 0.5 mm.

10. The method of claim 9, comprising stacking the memory module on top of the bottom module by solder bonding.

11. The method of claim 9, comprising wirebonding the dies of the bottom package with the substrate.

12. An integrated circuit package with
    at least one bottom module with a stacked die package comprising at least two dies within one single mold cap and a substrate carrying the stacked die package and comprising connection elements, and
    at least one memory module stacked on top of the bottom module using a ball grid array, wherein the ball grid array connects the memory module with the connection elements of the substrate,
    wherein the single mold cap has a thickness that defines ball size, ball pitch, or both, for packing the memory module on top of the stacked die package.

13. The integrated circuit package of claim 12, wherein the single mold cap has a thickness of 375 μm.

14. A system comprising
    at least one bottom module with a stacked die package comprising at least two dies within one single mold cap and a substrate carrying the stacked die package and comprising connection elements, and
    at least one memory module stacked on top of the bottom module using a ball grid array, wherein the ball grid array connects the memory module with the connection elements of the substrate,
    wherein the single mold cap has a thickness that defines ball size, ball pitch, or both, for packing the memory module on top of the stacked die package.

15. An electronic device comprising an integrated circuit package with at least one bottom module with a stacked die package comprising at least two dies within one single mold cap and a substrate carrying the stacked die package and comprising connection elements, and at least one memory module stacked on top of the bottom module using a ball grid array, wherein the ball grid array connects the memory module with the connection elements of the substrate, wherein the single mold cap has a thickness that defines ball size, ball pitch, or both, for packing the memory module on top of the stacked die package.

16. A method for assembling an integrated circuit package comprising providing at least one bottom module with a stacked die package comprising at least two dies within one single mold cap and a substrate carrying the stacked die package and comprising connection elements, and stacking at least one memory module on top of the bottom module using a ball grid array, wherein the ball grid array connects the memory module with the connection elements of the substrate, wherein the single mold cap has a thickness that defines ball size, ball pitch, or both, for packing the memory module on top of the stacked die package.

\* \* \* \* \*